United States Patent
Yechuri

[11] Patent Number: 6,031,426
[45] Date of Patent: Feb. 29, 2000

[54] PHASE LOCKED LOOP WITH DIGITAL VERNIER CONTROL

[75] Inventor: Sitaramarao S. Yechuri, Fremont, Calif.

[73] Assignee: Avant! Corporation, Fremont, Calif.

[21] Appl. No.: 09/087,751

[22] Filed: May 29, 1998

[51] Int. Cl.[7] .................................................. H03L 7/06
[52] U.S. Cl. .................................. 331/2; 331/18; 331/47; 331/48; 327/156; 327/159; 327/162; 375/376
[58] Field of Search .................................. 331/2, 1 A, 47, 331/48, 18; 327/156, 159, 162; 375/376

[56] References Cited

U.S. PATENT DOCUMENTS 3,927,384  12/1975  Jezo ............................................. 331/2

Primary Examiner—Arnold Kinkead
Attorney, Agent, or Firm—Thomas E. Schatzel; Law Offices of Thomas E. Schatzel, A Prof. Corporation

[57] ABSTRACT

A phase-locked-loop-stabilized voltage controlled oscillator relies on a sampling of the analog-frequency-control voltage of a voltage-controlled oscillator in a phase-locked-loop circuit to act as a reference voltage for a second free-running voltage-controlled oscillator. A vernier-adjustment voltage is injected into the control input of the second voltage-controlled oscillator to produce a finely variable derivative frequency not otherwise producible by a conventional phase-locked-loop circuit.

5 Claims, 2 Drawing Sheets

PHASE LOCKED LOOP WITH DIGITAL VERNIER CONTROL

BACKGROUND OF THE INVENTION

1. Field of the Invention

The present invention is related to electronic circuits and more specifically to phase locked loop circuits that can be used to generate high resolution derivative frequency reference outputs.

2. Description of the Prior Art

A fundamental problem of phase noise exists in voltage controlled oscillators (VCO's). Typical VCO solutions usually select on-chip ring oscillators to eliminate the need for off-chip components, but ring oscillators have higher phase noise than LC-tank type oscillators. There are many synthesizer design tradeoffs required for high-integration receivers. New architectures and approaches for improving phase noise and spurious tone performance in local oscillators are being investigated. Innovations in this work have been made at several levels, including the PLL architectural level, PLL system level, and the radio architecture level.

Frequency synthesizer design has traditionally had to tradeoff between the loop bandwidth of the PLL and the frequency spacing of the oscillator output. A high bandwidth PLL can be used to reject ring-oscillator phase noise within the bandwidth of the PLL, but a higher bandwidth will also result in larger spurious tones. New architectures are being explored that attempt to work around this bottleneck, e.g., doing channel selection with the second local oscillator, and allowing the first local oscillator to be fixed-frequency. This allows the first synthesizer to use a higher loop bandwidth and maintain a locked PLL.

Some prior art fractional synthesis techniques use phase-interpolation blocks that interpolate between phases in ring oscillators to provide a fractional divide-by ratio in the PLL feedback loop. The result is a higher PLL loop bandwidth for a given channel spacing, and spurious tone level.

Digitally controlled phase locked loops (PLL's) have a granularity to their frequency outputs because the steps that occur in one output frequency to the next is a function of the least significant digital divider control bit. Vernier control to achieve a fractional part of a frequency step has not been available in PLL implementations.

SUMMARY OF THE INVENTION

It is therefore an object of the present invention to provide a phase locked loop with a vernier control that can cause fractional parts of the otherwise stepped frequency synthesis to be generated.

It is a further object of the present invention to provide a digitally controlled analog oscillator with a wide range of frequency outputs all susceptible to vernier adjustment.

Briefly, a phase-locked-loop-stabilized voltage controlled oscillator embodiment of the present invention samples the analog frequency control voltage of a voltage controlled oscillator in a phase locked loop circuit to act as a reference voltage for a second free running voltage controlled oscillator. A vernier adjustment voltage is injected into the control input of the second voltage controlled oscillator to produce a finely variable derivative frequency not otherwise producible by a phase locked loop circuit.

An advantage of the present invention is that an open-loop voltage controlled oscillator is provided that is very stable.

Another advantage of the present invention is that an open-loop voltage controlled oscillator is provided that can be finely and precisely adjusted with a vernier control.

These and other objects and advantages of the present invention will no doubt become obvious to those of ordinary skill in the art after having read the following detailed description of the preferred embodiments which are illustrated in the various drawing figures.

IN THE DRAWINGS

FIG. 1 is a functional block diagram of a phase locked loop embodiment of the present invention; and, FIG. 2 is a block diagram of a further embodiment of the present invention.

DETAILED DESCRIPTION OF THE PREFERRED EMBODIMENT

Figure 1:
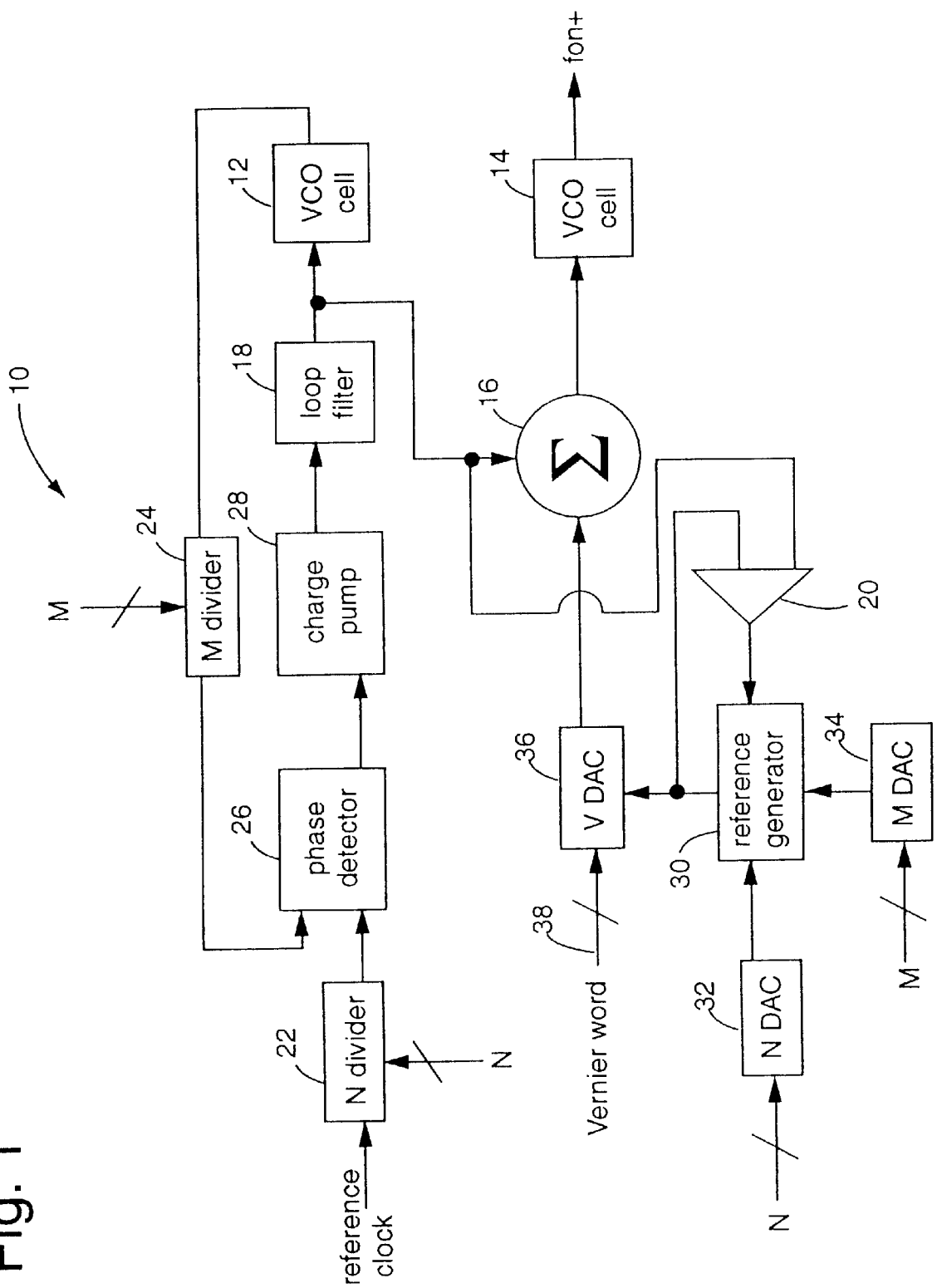

In FIG. 1, a phase locked loop (PLL) stabilized voltage controlled oscillator (VCO) embodiment of the present invention is referred to by the general reference numeral 10. The PLL-VCO 10 comprises a first voltage controlled oscillator (VCO) cell 12 that is a part of a traditional phase locked loop in a closed-loop configuration. A second VCO cell 14 is run non-traditionally in an open-loop configuration that receives its analog control voltage from an analog summer 16. The VCO cell 12 receives an analog frequency-correction voltage from a loop filter 18 and a sample is provided to the summer 16 and a voltage comparator 20. It would be advantageous for the two VCO cells 12 and 14 to be a matched pair so that the analog frequency-correction voltage inputs to each results in identical frequency responses at their respective outputs. Other environmental changes should also produce identical responses.

The PLL-VCO 10 further comprises an N bit divide-by-N counter 22 which receives a reference clock input, e.g., 10.000 MHz, and an N digital control word to control the division of the reference clock frequency. An M bit divide-by-M counter 24 divides down the output of the VCO cell 12 under the control of an M digital control word. A phase comparator 26 detects any frequency/phase differences between the outputs of the divide-by-N counter 22 and divide-by-M counter 24. A plus or minus difference output from the phase comparator 26 is used to drive a charge pump 28 up or down. Charge pump 28 generates an analog voltage that is smoothed out by the loop filter 18 in order to generate the analog control voltage which is input into VCO cell 12.

The sample of the analog control voltage carried to the comparator 20 is measured against the analog output of an analog reference voltage generator 30. A baseline analog voltage is set by a "N" bit digital to analog converter (N-DAC) 32 and a "M" bit digital to analog converter (M-DAC) 34. The N-DAC 32 and the M-DAC 34 respectively receive the N and M digital control words provided to the divide-by-N counter 22 and divide-by-M counter 24. A V' bit digital to analog converter (V-DAC) 36 for vernier control is provided an operational reference voltage from the analog reference voltage generator 30 and produces a fractional control that is output to the summer 16 according to a digital vernier control word 38.

Figure 2:
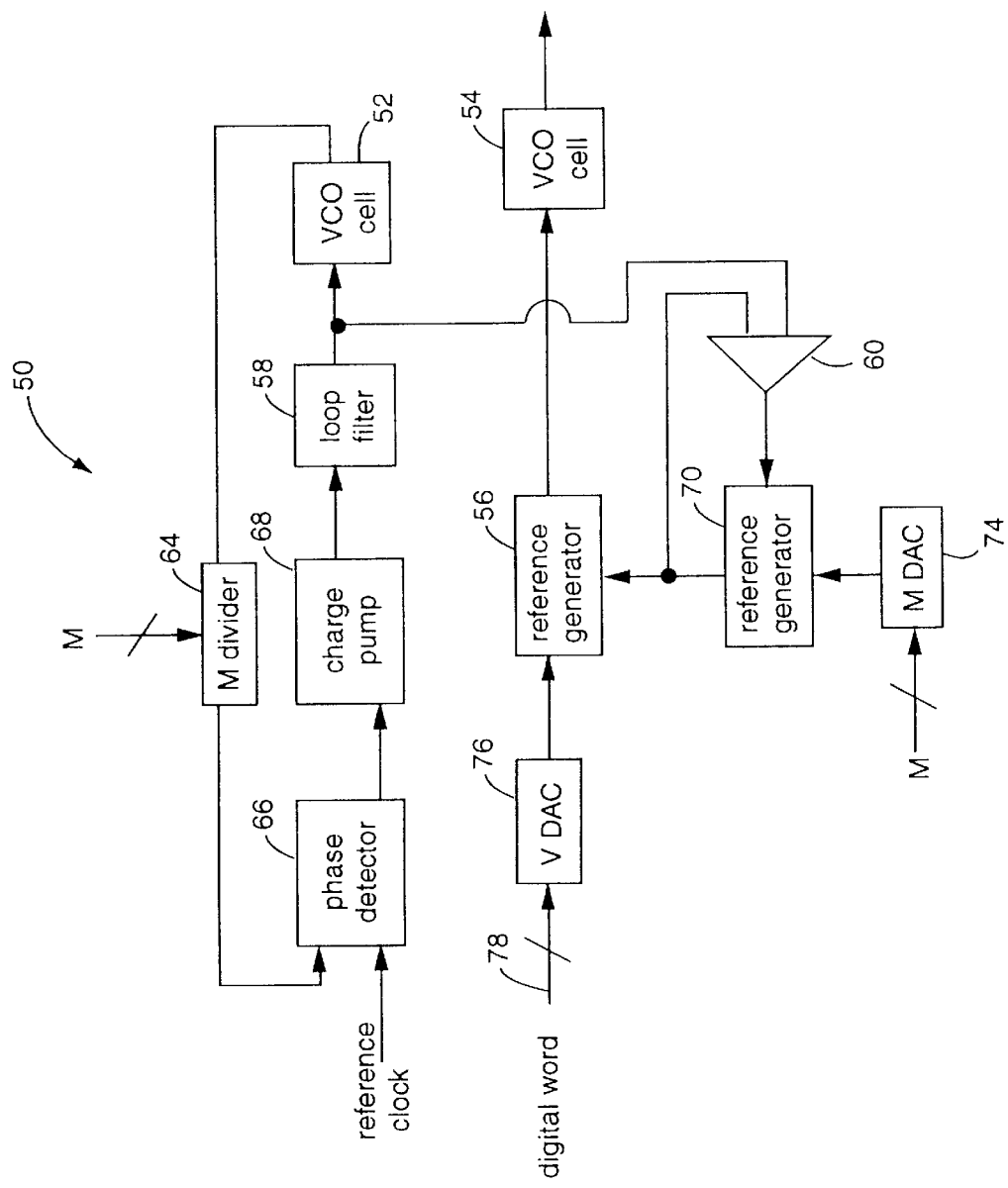

In FIG. 2, a phase locked loop (PLL) stabilized voltage controlled oscillator (VCO) embodiment of the present invention is referred to by the general reference numeral 50. The PLL-VCO 50 comprises a first voltage controlled oscillator (VCO) cell 52 that is a part of a traditional phase locked loop in a closed-loop configuration. A second VCO cell 54 is run non-traditionally in an open-loop configuration that receives its analog control voltage from an analog-voltage reference generator 56. The VCO cell 52 receives an analog frequency-correction voltage from a loop filter 58 and a sample is provided to a voltage comparator 60. The two VCO cells 52 and 54 are preferably a matched pair so that the analog frequency-correction voltage inputs to each results in identical frequency responses at their respective outputs. Other environmental changes should also produce identical responses.

The PLL-VCO 50 further comprises a divide-by-M counter 64 that divides down the output of the VCO cell 52. A phase comparator 66 detects any frequency/phase differences between the output of the divide-by-M counter 64 and a reference clock input, e.g., 10.000 MHz. A plus or minus difference output from the phase comparator 66 is used to drive a charge pump 68 up or down. Charge pump 68 generates an analog voltage that is smoothed out by the loop filter 58 in order to generate the analog control voltage which is input into VCO cell 52.

The sample of the analog control voltage carried to the comparator 60 is measured against the analog output of a second range-control analog reference voltage generator 70. A baseline analog voltage is set by an "M" bit digital to analog converter (M-DAC) 74 which receives an "M" digital control word. A V' bit digital to analog converter (V-DAC) 76 for vernier control produces a fractional control that is output to the reference generator 56 according to a digital vernier control word 78.

The present invention differs from the prior art in that two VCO's are used to produce a single frequency synthesis output. The second VCO cell is near identical to the first VCO cell with similar circuitry in order to have similar responses to environmental changes. The first VCO is locked in the phase locked loop. The second VCO uses the PLL lock control voltage and an additional "vernier" word to operate at a different frequency than the first VCO.

The M and N dividers allow the primary (coarse) frequency fix of the VCO cell in the phase locked loop. The second VCO cell receives the sum of the control voltage of the first VCO (in the PLL) and the fractional control generated by the V-DAC 76. The fractional control signal is designed such that its range of signal is approximately twice the change in voltage for a unit step in M. For this reason, the V-DAC 36 has input as a reference voltage the bias voltage generated by the reference generator 30 which is based on the N word. The bias voltage generated by the reference generator 30 for input into the V-DAC 36 is also affected by a combination of the M word and the analog control voltage, using a "predictor-corrector" feedback loop. This has the additional effect of "locking" the V-DAC 36 to the closed loop PLL of which VCO 12 is a part. For example, if the temperature changes thereby causing the gain of the VCO 12 to change, the V-DAC 36 output is adjusted as a result of the analog control voltage changes generated as the closed loop PLL adjusts, thereby maintaining the same frequency offset from the frequency of the closed loop PLL. In this manner the frequency weight of each vernier bit will be independent of process, temperature, and other environmental changes.

The net result is that the output frequency, though not exactly "phase locked" is very nearly so, the main advantage is that the vernier allows approximately V bits order of magnitude (Base 2) more accurate resolution of output frequency, i.e., the resolution of the time period is equal to the inverse of two raised to the power of V, while at the same time avoiding the instability of the loop that would occur if the M and N division was increased. For example, the output has the same type of lock time, acquisition time and other loop dynamics of the M/N PLL by itself, but with better frequency resolution.

Alternatively, if the bit weight of the vernier is increased, the system can be used as a digitally controlled oscillator as shown in FIG. 2.

FIG. 2 is substantially simpler than the architecture of FIG. 1, and offers substantially lower design risk. Here, there is no summation of control voltages, and the digital word directly controls the entire range of the VCO. The training of the reference generators 56 and 70 by the circuitry of FIG. 2 is also much improved over the architecture of FIG. 1, and can be designed with lower risk. However, the only drawback is that the frequency step resolution is lower than that of the architecture in FIG. 1. However, the reference generators 56 and 70 are locked with the closed loop PLL of which VCO 52 is a part by sampling the analog control voltage.

Apart from the advantage of the lower design risk, the architecture in FIG. 2 has the additional advantage over the architecture of FIG. 1, and indeed over any PLL, that the rate at which the frequency of the VCO 54 can be modulated depends only on the frequency of operation of the V-DAC 76, and not the response time of the closed loop PLL. Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A frequency synthesizer, comprising:
    a phase locked loop circuit that includes a first voltage controlled oscillator;
    a sample port connected to export a control-voltage measurement obtained at a first control input of said first voltage controlled oscillator;
    a second voltage controlled oscillator having a second control input connected to receive said control-voltage measurement from said sample port and providing for an open-loop reference frequency signal that is stabilized by the phase locked loop circuit on an output port; and
    a vernier unit for injecting an analog signal into said second control input of said second voltage controlled oscillator;
    wherein, a fractional frequency adjustment of said open-loop reference frequency signal made in proportion to said analog signal injected into said second control input, and the second voltage controlled oscillator operates at a stable offset frequency from that of the first voltage controlled oscillator.

2. The frequency synthesizer of claim 1, further comprising:
    a vernier digital-to-analog converter (V-DAC) included in the vernier unit and connected to produce said analog signal injected into said second control input that is dependent on a vernier digital input word.

3. The frequency synthesizer of claim 2, further comprising:
    an "M bit" digital-to-analog converter (M-DAC) connected to add an $2^M$-component analog baseline to said analog signal injected into said second control input that is dependent on an "M" digital input word.

4. The frequency synthesizer of claim 3, further comprising:

an "N bit" digital-to-analog converter (N-DAC) connected to add an $2^N$-component analog baseline to said analog signal injected into said second control input that is dependent on an "N" digital input word.

5. A frequency synthesizer, comprising:

a phase locked loop circuit that includes a first voltage controlled oscillator;

an external reference source connected to provide a reference clock input to the phase locked loop;

a sample port connected to export a control-voltage measurement obtained at a first control input of said first voltage controlled oscillator;

a second voltage controlled oscillator having a second control input connected to receive said control-voltage measurement from said sample port and providing for an open-loop reference frequency signal that is stabilized by the phase locked loop circuit on an output port;

a vernier unit for injecting an analog signal into said second control input of said second voltage controlled oscillator, wherein, a fractional frequency adjustment of said open-loop reference frequency signal is made in proportion to said analog signal injected into said second control input, and the second voltage controlled oscillator operates at a stable offset frequency from that of the first voltage controlled oscillator;

a vernier digital-to-analog converter (V-DAC) disposed within the vernier unit and connected to produce said analog signal injected into said second control input from a vernier digital input word;

an "M bit" digital-to-analog converter (M-DAC) connected to add an $2^M$-component analog baseline to said analog signal injected into said second control input from an "M" digital input word;

an "N bit" digital-to-analog converter (N-DAC) connected to add an $2^N$-component analog baseline to said analog signal injected into said second control input from an "N" digital input word;

a digital divider connected between the external reference source and a phase detector included in the phase locked loop, and including an input to receive an "N" digital input word; and a digital divider connected between the first voltage controlled oscillator and a phase detector included in the phase locked loop, and including an input to receive an "M" digital input word.

* * * * *